(12) United States Patent
Fujimasa

(10) Patent No.: US 11,573,640 B2
(45) Date of Patent: Feb. 7, 2023

(54) INPUT DEVICE

(71) Applicant: Faurecia Clarion Electronics Co., Ltd., Saitama (JP)

(72) Inventor: Toshiyuki Fujimasa, Saitama (JP)

(73) Assignee: Faurecia Clarion Electronics Co., Ltd., Saitama (JP)

( * ) Notice: Subject to any disclaimer, the term of this patent is extended or adjusted under 35 U.S.C. 154(b) by 0 days.

(21) Appl. No.: 17/729,098

(22) Filed: Apr. 26, 2022

(65) Prior Publication Data

US 2022/0350408 A1 Nov. 3, 2022

(30) Foreign Application Priority Data

Apr. 28, 2021 (JP) .............................. JP2021-075566

(51) Int. Cl.
*G06F 3/01* (2006.01)
*H01L 41/25* (2013.01)
*G06F 3/041* (2006.01)
*H01L 41/311* (2013.01)

(52) U.S. Cl.
CPC ............ *G06F 3/016* (2013.01); *G06F 3/0412* (2013.01); *G06F 3/04164* (2019.05); *H01L 41/25* (2013.01); *H01L 41/311* (2013.01); *G06F 2203/04105* (2013.01)

(58) Field of Classification Search
None
See application file for complete search history.

(56) References Cited

U.S. PATENT DOCUMENTS

| 2014/0028573 | A1 | 1/2014 | Olien et al. |
| 2021/0149491 | A1* | 5/2021 | Takahashi ........... G06F 3/03547 |
| 2021/0342006 | A1* | 11/2021 | Nakamura .............. G06F 3/016 |
| 2022/0247292 | A1* | 8/2022 | Takahashi ............... G06F 3/016 |

FOREIGN PATENT DOCUMENTS

| JP | 2015-522897 A | 8/2015 |
| WO | 2014/018211 A2 | 1/2014 |

* cited by examiner

*Primary Examiner* — Krishna P Neupane
(74) *Attorney, Agent, or Firm* — IP Business Solutions, LLC

(57) ABSTRACT

The input device includes an LCD panel, a touch sensor arranged over the surface of the LCD panel, and a vibration generating unit having an actuator and a strain detector, the vibration generating unit being arranged on the back side of the LCD panel and connected to a securing portion provided on the back surface of the LCD panel via a rigid connecting member.

6 Claims, 10 Drawing Sheets

INPUT DEVICE

CROSS-REFERENCE TO RELATED APPLICATIONS

The present application claims priority under 35 U.S.C. § 119 to Japanese Patent Application No. 2021-075566 filed on Apr. 28, 2021. The content of the application is incorporated herein by reference in its entirety.

BACKGROUND OF THE INVENTION

Field of the Invention

The present invention relates to an input device.

Description of the Related Art

Configurations are known that provide tactile feedback to touch operations by vibrating a touch screen.

A compliant suspension member used to mount an electronic touch screen or touch surface is disclosed in Patent Document 1. At least one compliant suspension member connects a touch screen component and a housing component so that the touch screen component can move relative to the housing component. Force is generated to move the touch screen component relative to the housing component, and piezoelectric material segments that provide the user of the touch screen component with the resulting haptic effect are connected to the opposite side of at least one suspension member. At least one suspension member allows the touch screen component to move relative to the housing component in a first direction in response to force generated by a piezoelectric material segment, and movement between the touch screen component and the housing component is suppressed in at least a second direction.

PRIOR ART DOCUMENTS

Patent Documents

[Patent Document 1]
JP 2015-522897 A

In a configuration of the prior art, when the touch screen is vibrated by the actuator, transmission loss cannot be ignored in the route that transmits vibrations from the actuator.

SUMMARY OF THE INVENTION

In view of this situation, it is an object of the present invention to provide a configuration that can efficiently transmit vibrations to the touch screen when vibrating a touch screen with an actuator to provide tactile feedback.

In order to achieve this object, the input device disclosed herein comprises: a display panel; a touch sensor arranged over the surface of the display panel; and a vibration generating unit having an actuator and a strain detector, wherein the vibration generating unit is arranged on the back side of the display panel and connected to a securing portion provided on the back surface of the display panel via a rigid connecting member.

Effect of the Invention

According to the present disclosure, it is able to efficiently transmit vibrations generated by the actuator to the touch sensor via the connecting member.

DETAILED DESCRIPTION OF THE INVENTION

Figure 1:
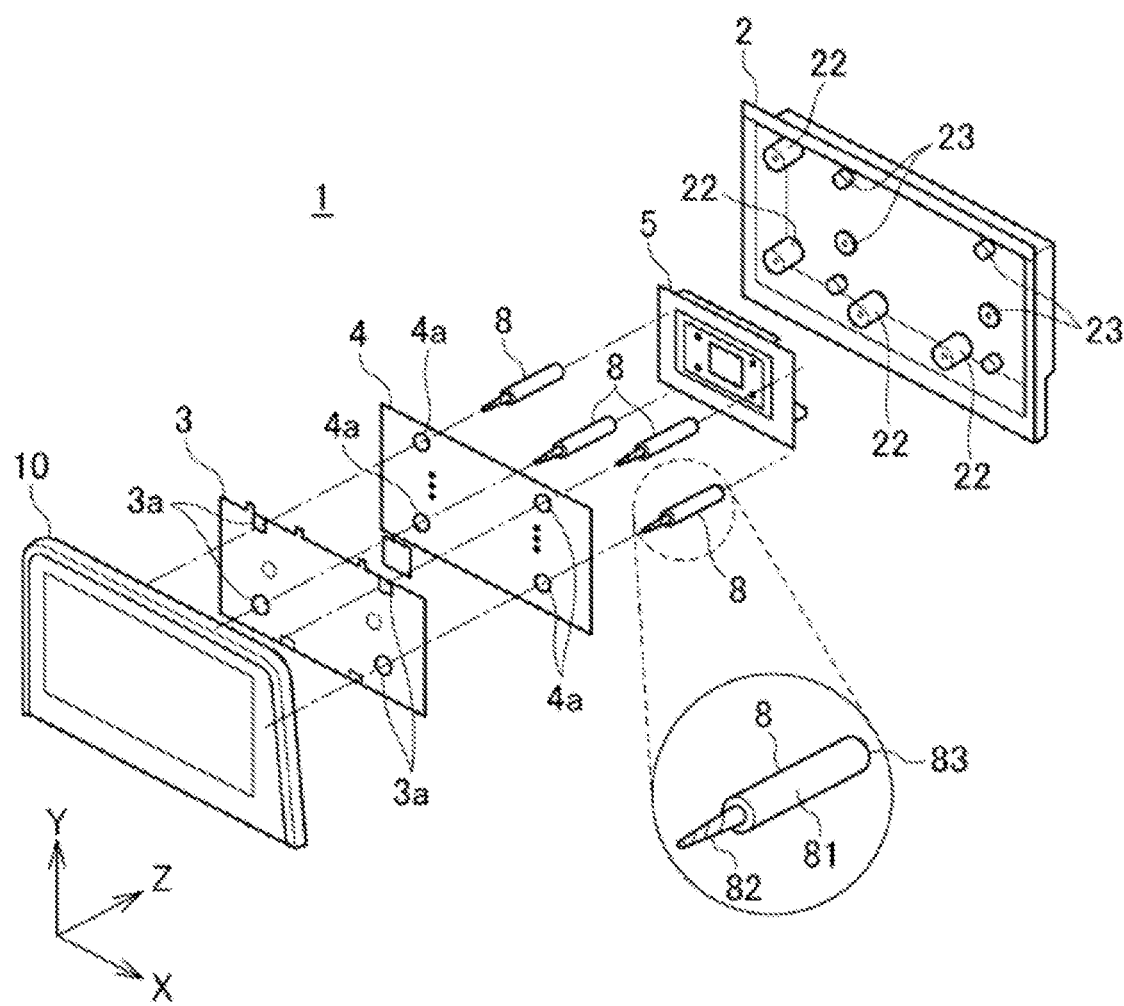
FIG. 1 is an exploded perspective view of the input device.
Figure 2:
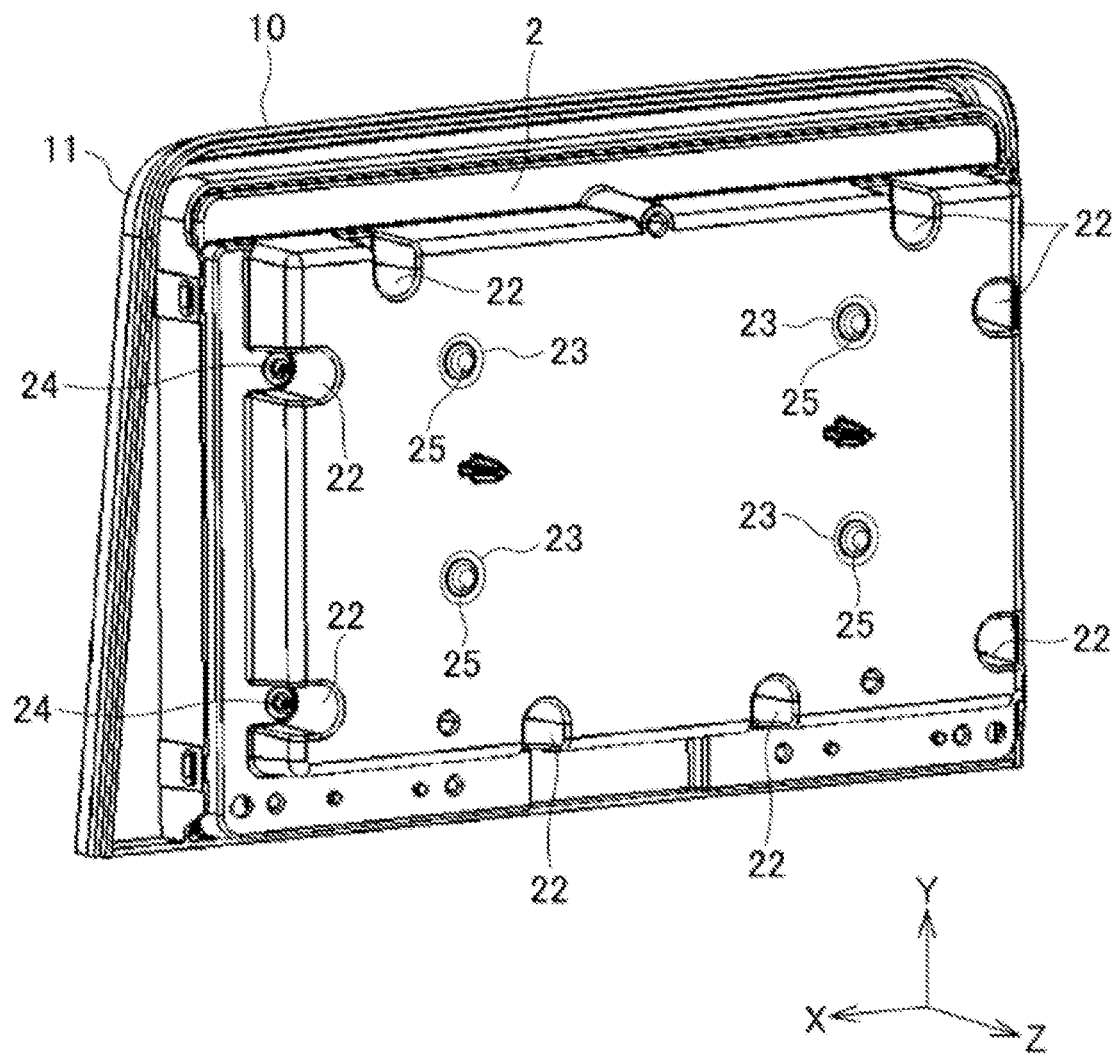
FIG. 2 is a perspective view showing the back side of the input device.

The following is a description of an embodiment of the present invention with reference to the appended figures. FIG. 1 is an exploded perspective view of the input device 1. FIG. 2 is a perspective view showing the back side of the input device 1.

The input device 1 functions as a display device by displaying images on a display unit 10. The input device 1 also functions as an input device that accepts input by detecting touch operations on the display surface. In FIG. 1 and each figure referenced below, the horizontal direction of the installed input device 1 is the X direction. For the sake of convenience, in the present embodiment, the direction from the left end of the display screen in the input device 1 to the right end is the X+ direction. The vertical direction of the installed input device 1 is the Y direction. The Y+ direction corresponds to the up direction on the input device 1, and the Y− direction corresponds to the down direction on the input device 1. The depth direction of the input device 1 is the Z direction. The Z+ direction corresponds to the rear on the input device 1, the Z− direction corresponds to the front of the input device 1, and the display surface of the display unit 10 corresponds to the front surface of the input device 1.

As shown in FIG. 1, the input device 1 includes a case 2, a shield plate 3, a circuit board 4, a vibration generating unit 5, and a display unit 10. The case 2 is a metal case that covers the back surface of the input device 1, and the display unit 10 and the case 2 constitute the exterior of the input device 1.

The vibration generating unit 5 includes an actuator 61 that generates vibrations (FIG. 4) and a strain gauge 66 (FIG. 6) that detects pressing force applied to the display unit 10. The configuration of the vibration generating unit 5 will be described in greater detail later.

The vibration generating unit 5 is arranged on the back side of the display unit 10. A shield plate 3 and a circuit board 4 are arranged between the display unit 10 and the vibration generating unit 5. A circuit for controlling the touch sensor 12 and a control circuit 100 described later are mounted on the circuit board 4. The shield plate 3 is a metal plate or thin film that provides an electromagnetic shield between the circuit board 4 and the display unit 10.

A plurality of protruding portions 22 are formed on the front surface of the case 2. These protruding portions 22 make contact with the back surface of the circuit board 4 when the input device 1 has been assembled. Each protruding portion 22 has a hole through which a screw 24 can pass, and the screws 24 pass through the protruding portions 22 from the back surface of the case 2. The shield plate 3 and the circuit board 4 are fastened to the protruding portions 22 by the screws 24, and are interposed and secured between the case 2 and the display unit 10.

The vibrations generated by the vibration generating unit 5 are transmitted to the display unit 10, and cause the display unit 10 to vibrate. In order to absorb these vibrations, an elastic member made of synthetic resin or rubber may be arranged between the display unit 10 and the case 2.

A plurality of protruding portions 23 are formed on the front surface of the case 2. The protruding portions 23 come into contact with the back surface of the vibration generating unit 5 when the input device 1 has been assembled. A hole through which a screw 25 can pass is formed in each protruding portion 23. The case 2 and the vibration generating unit 5 are secured by securing screws 25 in the protruding portions 23 from the back surface of the case 2.

Figure 3:
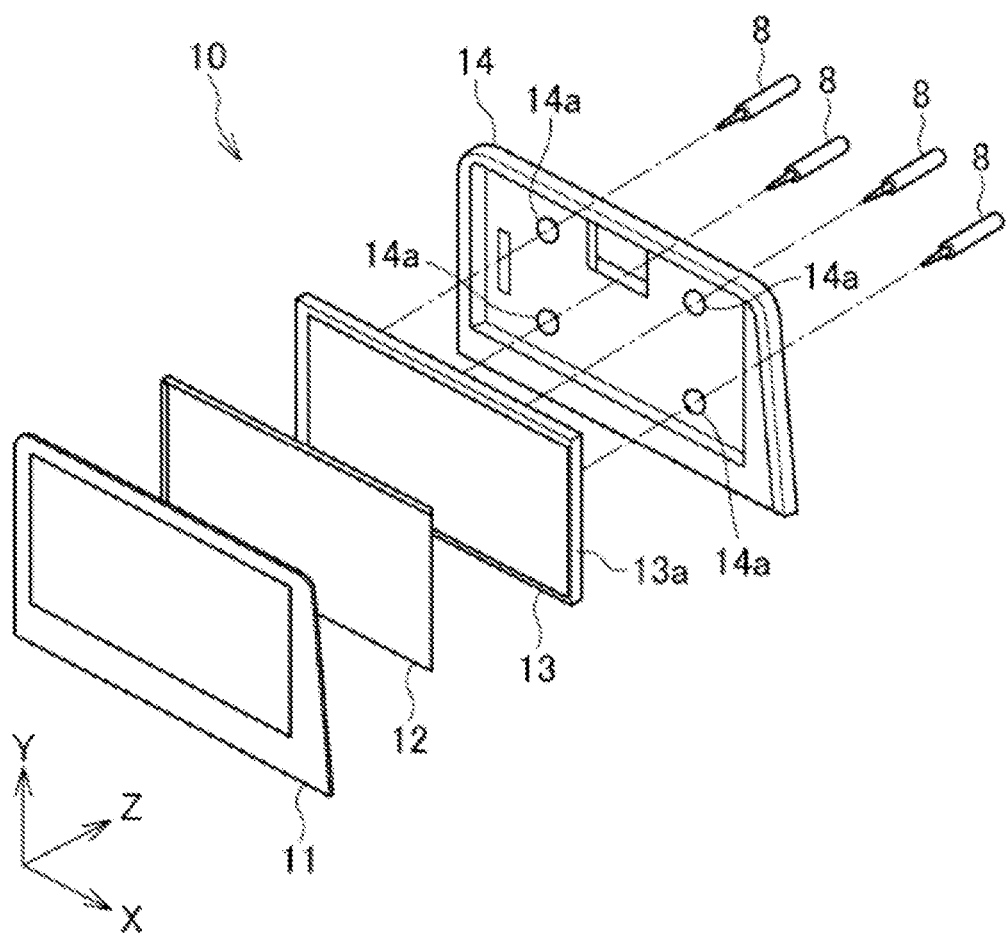
FIG. 3 is an exploded perspective view of the display unit.
Figure 4:
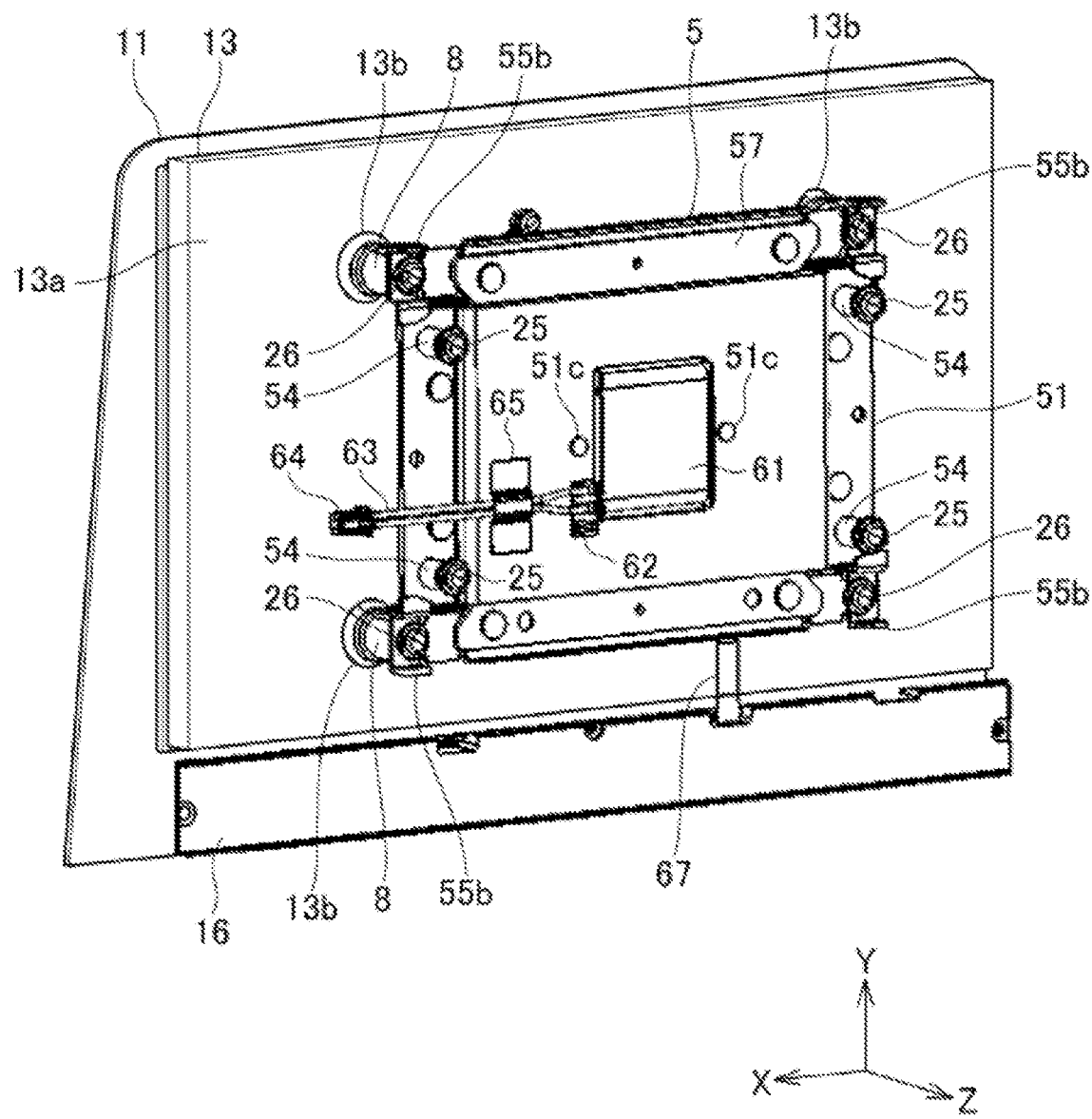
FIG. 4 is a perspective view showing the input device with the case removed.

FIG. 3 is an exploded perspective view of the display unit 10. FIG. 4 is a perspective view showing the input device 1 with the case 2 removed.

As shown in FIG. 3, the display unit 10 includes a cover lens 11, a touch sensor 12, a liquid crystal display (LCD) panel 13, and a cover 14.

The cover lens 11 is a translucent cover that protects the surface of the touch sensor 12 and that is secured to a frame made of synthetic resin. The touch sensor 12 is a sensor that detects touch operations on the surface of the cover lens 11, and that is arranged over the front surface of the LCD panel 13. There are no particular restrictions on the detection method used by the touch sensor 12. Examples include capacitance-type sensors and pressure sensitive-type sensors. The LCD panel 13 is a display panel for displaying images, and includes a cover 13a (FIG. 4) that covers the sides and the back of the panel. The display unit 10 may be configured to include an organic electro-luminescence (EL) panel or some other display panel instead of a LCD panel 13. Here, the display panel preferably has a metal cover 13a. The cover 14 is joined to the cover lens 11 and houses the touch sensor 12 and the LCD panel 13. The cover 14 is one example of a cover member.

The vibration generating unit 5 is connected to the LCD panel 13 by connecting members 8. The connecting members 8 have a columnar shaft portion 81, which is enlarged in the circle shown in FIG. 1. The leading end 82 of each connecting member 8 is tapered and has male threading. A hole in which a screw 26 can be fastened is formed in the rear end 83 opposite the leading end 82.

The connecting members 8 are made of a material that has predetermined rigidity and that does not easily expand, contract, or become elastically deformed. For example, the connecting members 8 can be made of metal such as aluminum, iron, stainless steel, or brass. The connecting members 8 may also be made of an engineering plastic such as polyacetal, polyamide, polycarbonate, modified polyphenylene ether, or polybutylene terephthalate. The connecting member 8 is preferably made of metal. The shaft portion 81 may have a round cylindrical shape or angular cylindrical shape. The connecting members 8 connect the back surface of the LCD panel 13 to the vibration generating unit 5.

FIG. 4 shows the vibration generating unit 5 secured to the LCD panel 13 by the connecting members 8. In FIG. 4, the cover 14, the shield plate 3, and the circuit board 4 have been omitted. As shown in FIG. 4, a board cover 16 is arranged under the display unit 10. A circuit board (not shown) is housed inside the board cover 16.

The LCD panel 13 has a metal cover 13a that covers the sides and back of the LCD panel 13. On the back surface of the LCD panel 13, the cover 13a is provided with securing portions 13b. In the present embodiment, four securing portions 13b are provided on the LCD panel 13. The securing portions 13b have holes into which shaft portions 81 can be screwed. Female threading may be formed in these holes.

The shaft portions 81 of the connecting members 8 are screwed into the securing portions 13b and secured. Meanwhile, the rear ends 83 come into contact with the panel connecting portions 55b provided in the vibration generating unit 5. As described later, the panel connecting portions 55b are formed with threaded holes 56 through which screws 26 are passed. The vibration generating unit 5 is secured to the connecting members 8 by fastening screws 26 from the back surface of the vibration generating unit 5 into the rear ends 83 via the threaded holes 56. The screws 26, like the connecting members 8, are made of metal or an engineering plastic and can be considered rigid objects.

In this way, the vibration generating unit 5 and the LCD panel 13 are connected to each other via connecting members 8. External force applied to the LCD panel 13 is transmitted to the vibration generating unit 5 via the connecting members 8 between the LCD panel 13 and the vibration generating unit 5. Also, vibrations generated by the vibration generating unit 5 are transmitted to the LCD panel 13 via the connecting members 8.

Figure 5:
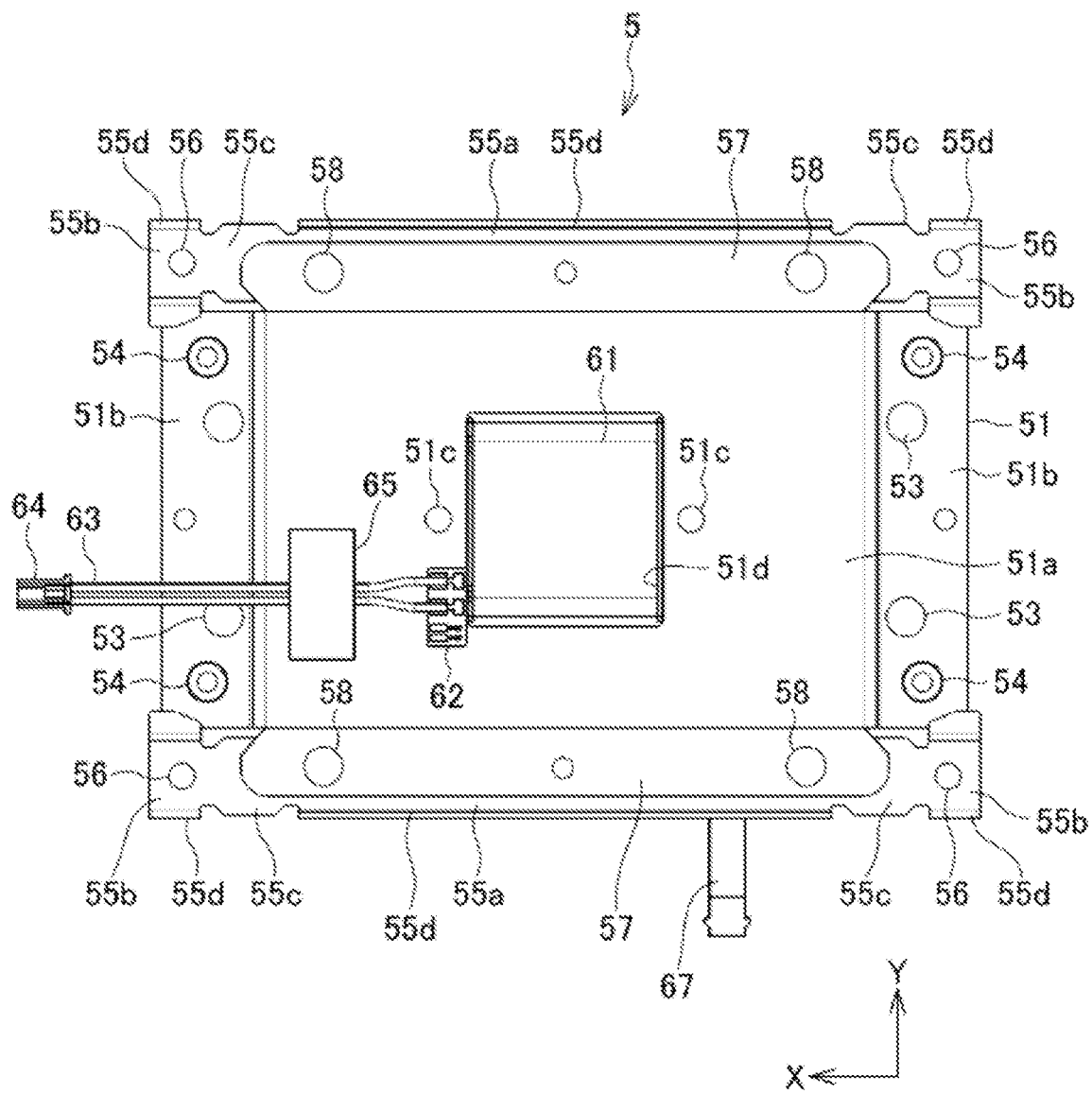
FIG. 5 is a rear view of the vibration generating unit.
Figure 6:
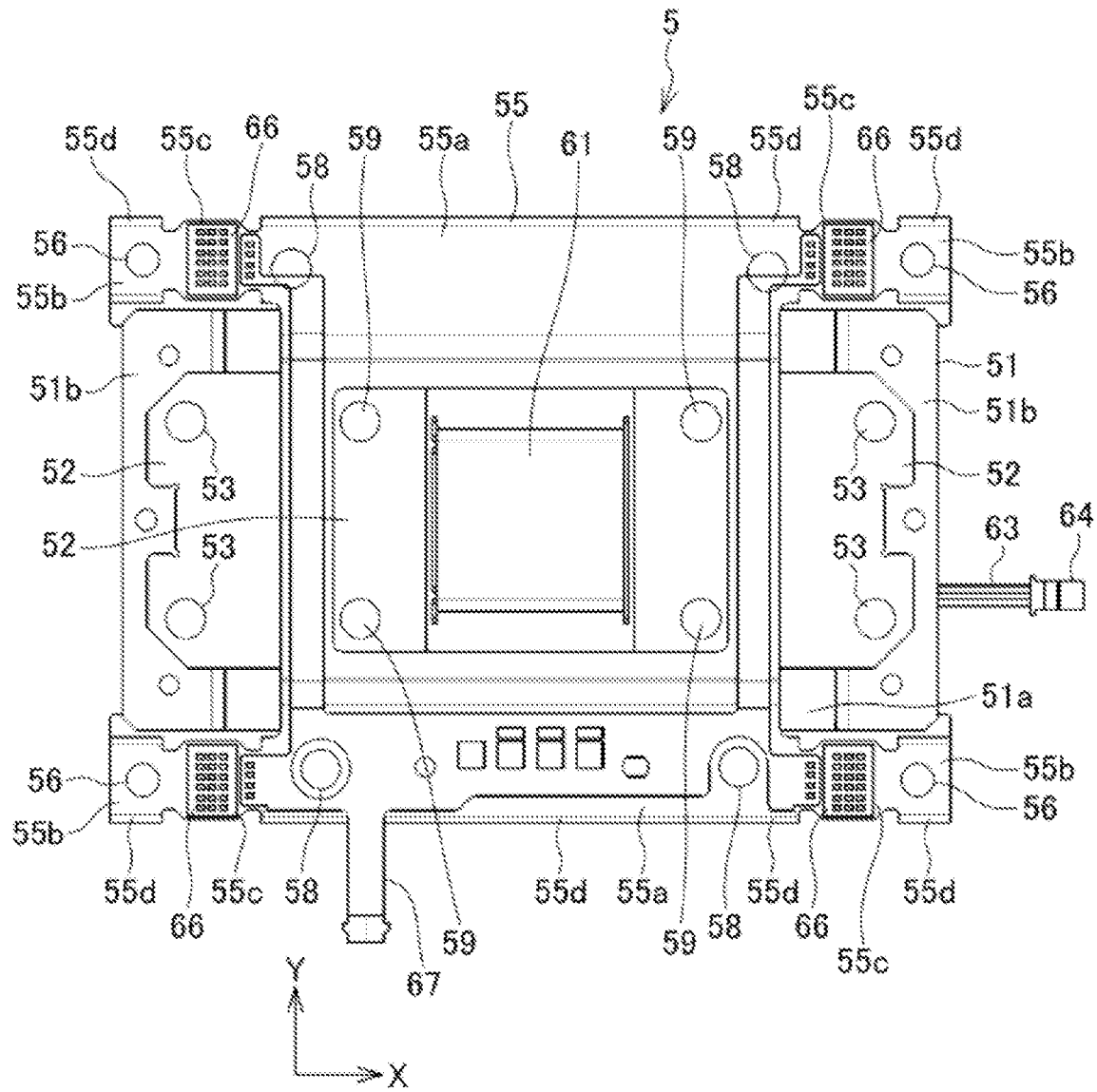
FIG. 6 is a front view of the vibration generating unit.
Figure 7:
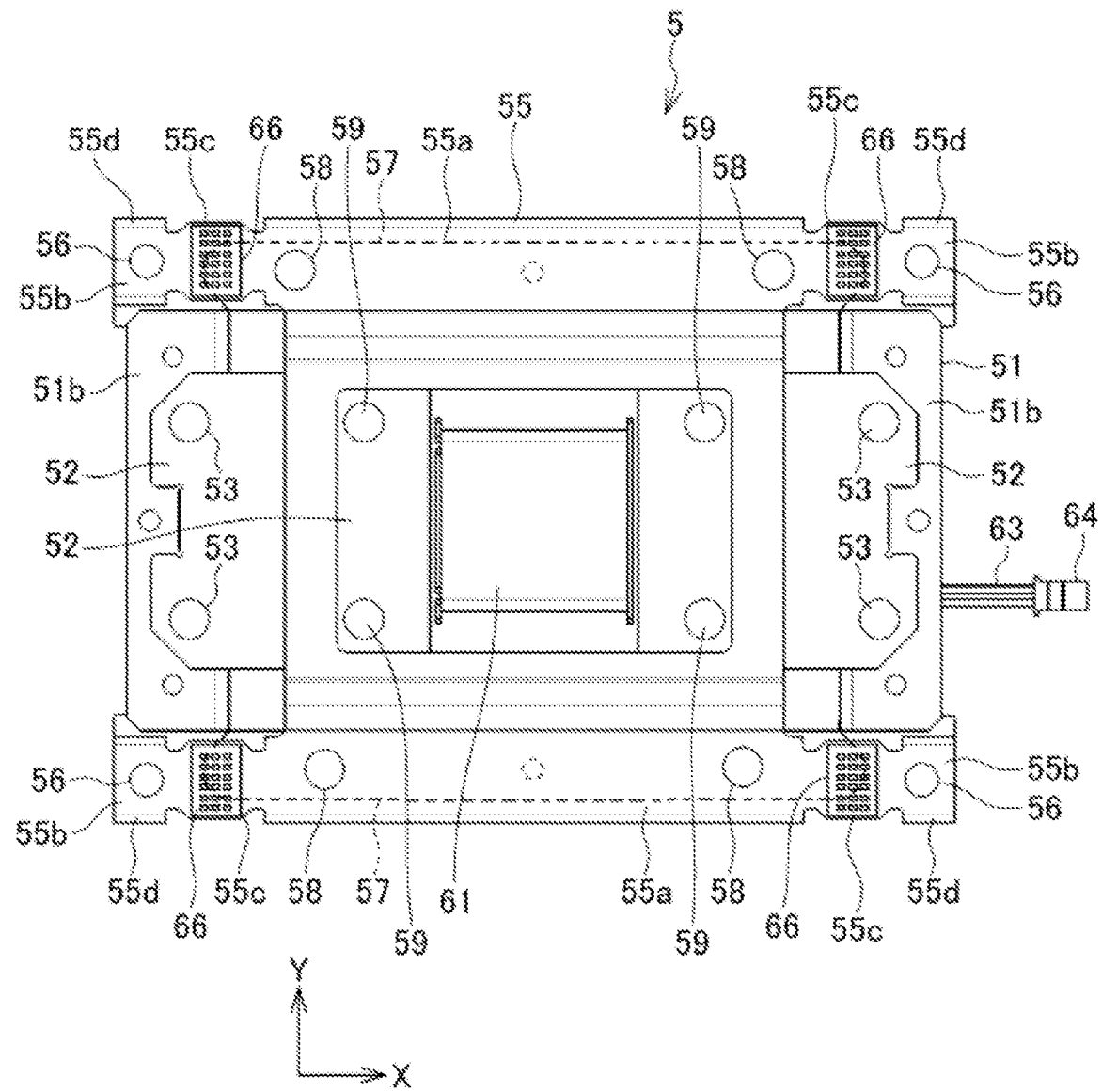
FIG. 7 is a front view of the vibration generating unit.
Figure 8:
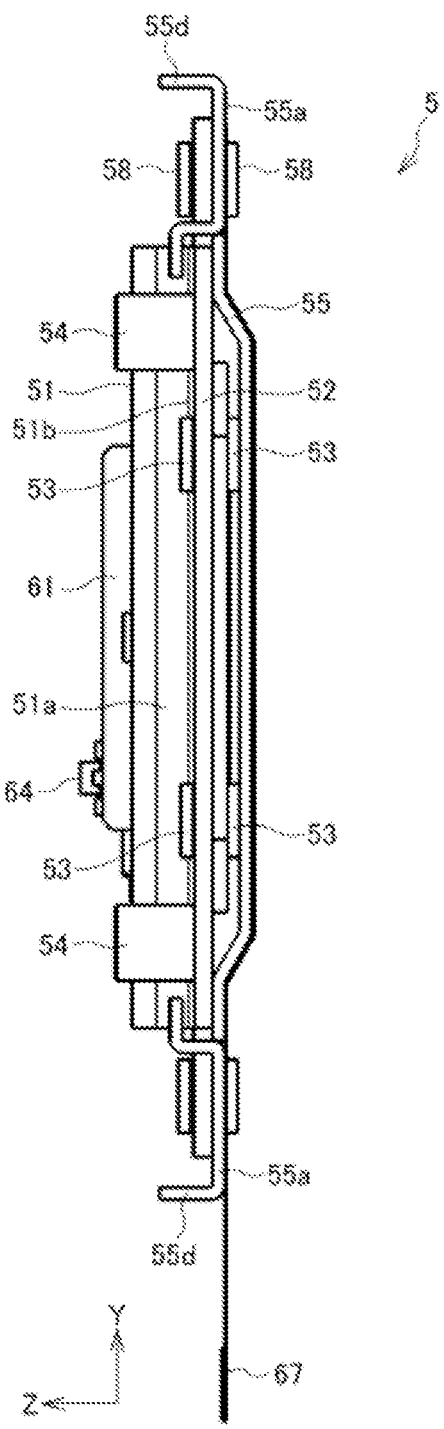
FIG. 8 is a side view of the vibration generating unit.
Figure 9:
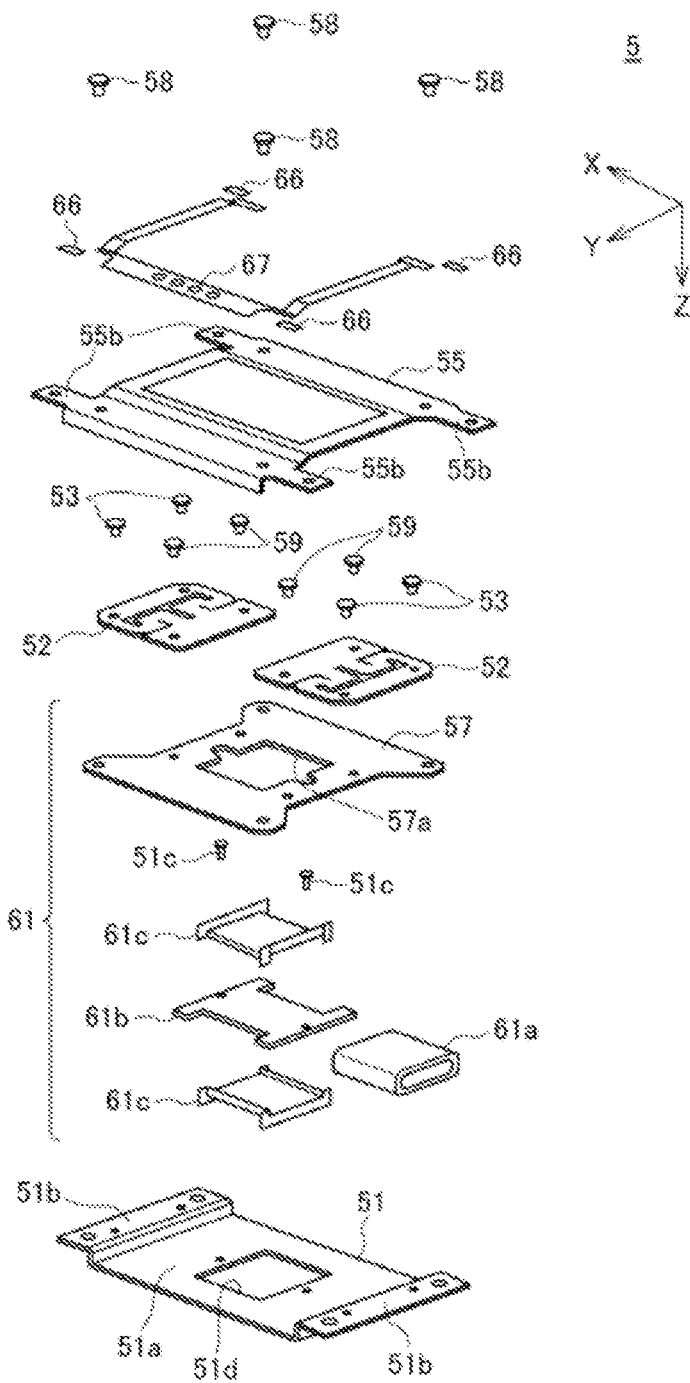
FIG. 9 is an exploded perspective view of the vibration generating unit.

FIG. 5 is a rear view of the vibration generating unit 5. FIG. 6 and FIG. 7 are front views of the vibration generating unit 5. In FIG. 7, the flexible board 67 has been removed. FIG. 8 is a side view of the vibration generating unit 5. Here, the vibration generating unit 5 is viewed in the X direction. FIG. 9 is an exploded perspective view of the vibration generating unit 5.

The vibration generating unit 5 includes an actuator supporting portion 51. The actuator supporting portion 51 is a flat metal plate-shaped member. As shown in FIG. 5 and FIG. 9, a recessed portion 51a projecting to the rear is formed in the substantially central portion of the actuator supporting portion 51 in the X direction. Both ends of the actuator supporting portion 51 in the X direction are flat plate portions 51b. The recessed portion 51a accommodates an actuator 61 with a predetermined thickness.

The actuator 61 is arranged on the front surface of the actuator supporting portion 51, and is secured to the actuator supporting portion 51 by rivets 51c so as to fit inside the recessed portion 51a. The actuator supporting portion 51 is one example of a supporting portion.

The actuator 61 is a vibration generating device that generates vibrations when electric power is supplied from a control circuit 100. The actuator 61 can be a piezoelectric actuator, a voice coil actuator, an eccentric rotary mass actuator, an E-core actuator, a solenoid, a movable magnet actuator, or some other actuator.

The actuator 61 in the present embodiment generates vibrations by electromagnetic action. As shown in FIG. 9, the actuator 61 has a coil winding 61a, a core 61b, and bobbins 61c, 61c. The bobbins 61c and 61c can be made of, for example, a synthetic resin, and are arranged so as to surround the core 61b, which is made of a magnetic material.

The coil winding 61a is a wire wound around the bobbins 61c, 61c. A through-hole is formed in the core 61b, and the core 61b is secured to the recessed portion 51a by a rivet 51c passing through the through-hole.

An opening 51d is formed in the central portion of the recessed portion Ma, and the actuator 61 is fitted inside the opening Md. As a result, part of the actuator 61 is exposed from the opening 51d on the back surface of the actuator supporting portion 51.

The actuator 61 has a support plate 57. The support plate 57 is a plate-shaped member made of a magnetic material, and more preferably made of a highly magnetic material. The support plate 57 has an opening 57a, and the coil winding 61a is housed inside the opening 57a when the actuator 61 has been assembled. The support plate 57 functions as a yoke when the coil winding 61a is housed inside the opening 57a.

A pair of leaf springs 52 are arranged on the front surface of the support plate 57. Both ends of the support plate 57 in the X direction are secured to the leaf spring 52 by rivets 59. The leaf springs 52 are also secured to the flat plate portions 51b of the actuator supporting portion 51 by the rivets 53. In other words, the support plate 57 is connected to the actuator supporting portion 51 via two leaf springs 52.

The leaf springs 52 are plate-shaped members made of an elastic spring material. Because the leaf springs 52 are also components of the magnetic circuit in the actuator 61, they are preferably made of a magnetic material, and more preferably made of a highly magnetic material. Due to the elasticity of the leaf springs 52, the support plate 57 is supported by the actuator supporting portion 51 in a vibrable state as described later.

When, for example, an AC pulse current is applied to the coil winding 61a, the support plate 57 reciprocates relative to the coil winding 61a. Because the core 61b is secured to the actuator supporting portion 51 by rivets 51c, the support plate 57 reciprocates relative to the actuator supporting portion 51 and generates vibrations.

As shown in FIG. 8, support columns 54 rise from the back surface of the flat plate portions 51b of the actuator supporting portion 51. The columns 54 are formed with holes into which screws 25 can be fastened. When the input device 1 has been assembled, the support columns 54 come into contact with the protruding portions 23 on the case 2 shown in FIG. 1. The actuator supporting portion 51 is secured to the case 2 by fastening screws 25 into the support columns 54 from the back surface of the case 2 through the protruding portions 22. As a result, the actuator 61 is secured to the case 2.

A terminal 62 for connecting a lead wire 63 to the actuator 61 is provided on the back surface of the actuator supporting portion 51. The lead wire 63 has a connector 64 connected to the control circuit 100 and is secured to the back surface of the actuator supporting portion 51 by tape 65.

A diaphragm 55 is secured to the front surface of the support plate 57 by the rivets 58. The diaphragm 55 is a plate-shaped member made of metal or a synthetic resin, and is preferably a non-magnetic material. The diaphragm 55 may have a shape that protrudes forward as shown in FIG. 8 in order to avoid interference with the leaf springs 52 and other components.

The diaphragm 55 has protruding portions 55a that protrude above and below the actuator supporting portion 51. A flat plate portion 55c with a narrow portion is formed at both ends of the protruding portions 55a in the X direction, and the leading end of each flat plate portion 55c forms a panel connecting portion 55b.

The ends of the protruding portions 55a are bent in the Y direction to form ribs 55d, which increases the rigidity of the protruding portion 55a and the panel connecting portions 55b in the front-rear direction. Ribs 55d are not formed in the flat plate portions 55c. Therefore, when force is applied to the panel connecting portions 55b in the front-rear direction, the force is concentrated in the flat plate portions 55c to elastically deform the flat plate portions 55c.

The panel connecting portions 55b come into contact with the rear end 83 of connecting members 8 when the input device 1 has been assembled. As described above, the panel connecting portions 55b are provided with threaded holes 56 through which screws 26 can be passed. The diaphragm 55 and connecting members 8 are connected by screws 26 passed through the threaded holes 56 and secured to the rear ends 83 of the connecting members.

Strain gauges 66 are arranged in the flat plate portions 55c on the front surface of the vibration generating unit 5. The strain gauges 66 are sensors that detect deformation of the flat plate portions 55c. In the vibration generation unit 5 of the present embodiment, two flat plate portions 55c are formed on protruding portions 55a located in the upper portion, and two flat plate portions 55c are formed on protruding portions 55a located in the lower portion. A strain gauge 66 is arranged on each of these four flat plate portions 55c. These strain gauges 66 are one example of strain detectors.

A flexible board 67 mounted on the front surface of the vibration generating unit 5 is connected to the strain gauges 66. The strain gauges 66 are connected to the control circuit 100 by the wiring formed on the flexible board 67.

As mentioned above, the panel connecting portions 55b of the vibration generating unit 5 in the input device 1 are connected to the securing portions 13b formed on the back surface of the cover 13a of the LCD panel 13 via connecting members 8.

When pressing force is applied to the LCD panel 13, the pressing force acts on the panel connecting portions 55b via the connecting members 8. Because the protruding portions 55a and the panel connecting portions 55b have ribs 55d, they are not easily deformed in the Z direction. As a result, when force is applied in the Z direction to the panel connecting portions 55b, the flat plate portions 55c are deformed by the force. The input device 1 can detect operations performed on the LCD panel 13 by detecting the deformation of the flat plate portions 55c by the strain gauges 66.

When the actuator 61 vibrates, the diaphragm 55 connected to the support plate 57 vibrates relative to the case 2 and the support plate 57. Vibration of the diaphragm 55 is transmitted from the panel connecting portions 55b to the cover 13a via the connecting members 8 to vibrate the display unit 10. In other words, the diaphragm 55 outputs vibrations due to operation of the actuator 61. The diaphragm 55 is one example of a vibrating member. In this configuration, because vibration of the diaphragm 55 is transmitted by rigid connecting members 8, vibration transmission loss can be suppressed and vibrations can be efficiently transmitted from the diaphragm 55 to the display unit 10.

In the input device 1, the connecting members 8 pass through the cover 14, the shield plate 3, and the circuit board 4. The cover 14 has through-holes 14a through which the connecting members 8 pass. The inner diameter of the through-holes 14a is equal to or greater than the outer diameter of the connecting members 8. The through-holes 14a are preferably large enough that the cover 14 does not restrict vibration of the connecting members 8 when the connecting members 8 vibrate. Even more preferably, the connecting members 8 do not come into contact with the inner surface of the through-holes 14*a* when the connecting members 8 vibrate. The through-holes 14*a* are one example of a second through-hole.

The shield plate 3 has through-holes 3*a* through which the connecting members 8 pass. The circuit board 4 has through-holes 4*a* through which the connecting members 8 pass. The inner diameters of the through-holes 3*a*, 4*a* are both equal to or greater than the outer diameter of the connecting members 8. The through-holes 3*a* are preferably large enough that the shield plate 3 does not restrict vibration of the connecting members 8 when the connecting members 8 vibrate. The connecting members 8 preferably do not come into contact with the inner surface of the through-holes 3*a* when the connecting members 8 vibrate. The same applies to the other through-holes 4*a*. The through-holes 3*a* are one example of a first through-hole.

Because the through-holes 3*a*, 4*a*, and 14*a* are formed in the shield plate 3, the circuit board 4, and the cover 14 through which the connecting members 8 pass, these members do not interfere with vibration of the connecting members 8. As a result, vibrations generated by the vibration generation unit 5 can be transmitted to the display unit 10 without transmission loss.

The through-holes 3*a* are not limited to holes with a circular cross-sectional profile. For example, the outer periphery of the shield plate 3 may have cutouts corresponding to the positions of the connecting members 8. The sample applies to the other through-holes 4*a*, 14*a*.

Figure 10:
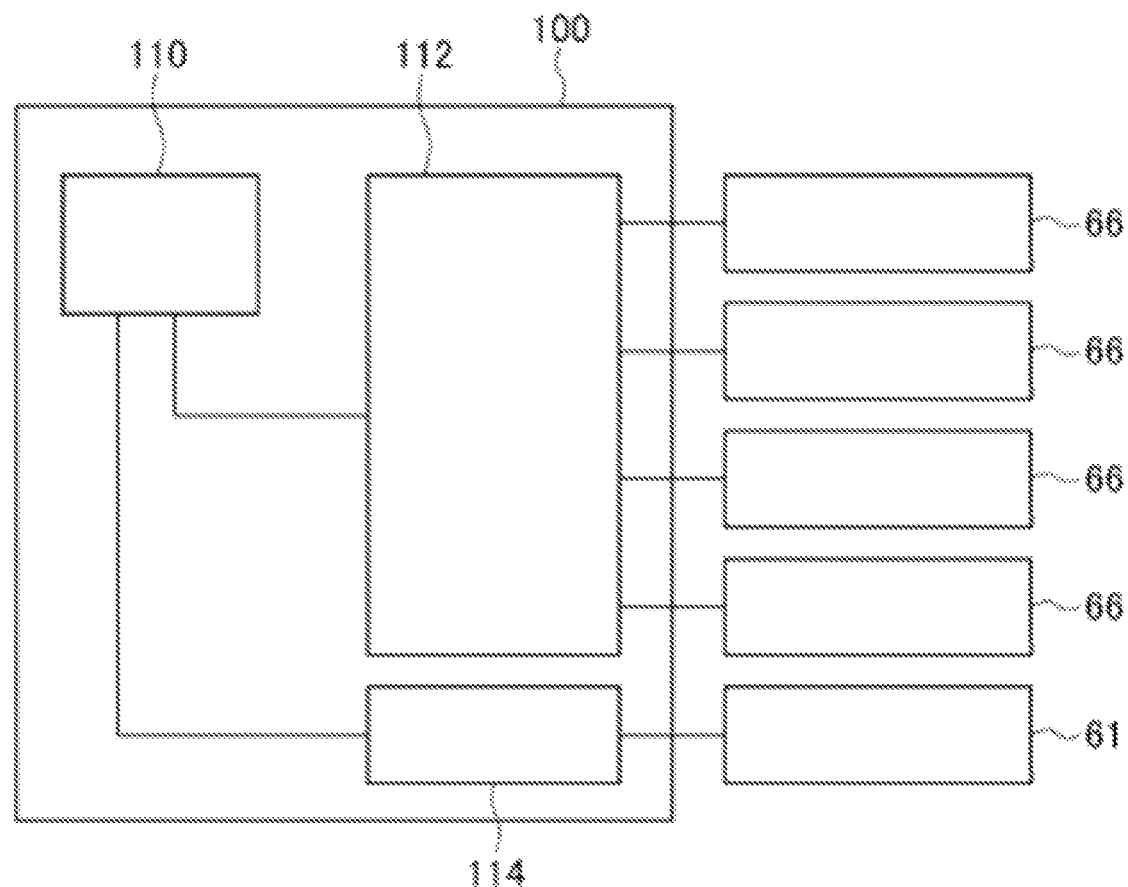
FIG. 10 is a block diagram showing the configuration of the control system for the input device.

FIG. 10 is a block diagram showing the configuration of the control system for the input device 1. The input device 1 has a control circuit 100. The control circuit 100 includes a control unit 110, a detection circuit 112, and a vibration generating circuit 114.

The detection circuit 112 is connected to the strain gauges 66, and the strain gauges 66 detect elastic deformation of the flat plate portions 55*c*. A vibration generating circuit 114 generates vibrations with the actuator 61 based on controls performed by the control unit 110. The vibration generating circuit 114 can vibrate the support plate 57, for example, by outputting an AC pulse current to the coil winding 61*a* of the actuator 61.

The control unit 110 acquires strain gauge 66 detection results from the detection circuit 112. The control unit 110 compares the values detected by the strain gauges 66 with a preset threshold value. The control unit 110 can, for example, calculate the average value or the median value of the values detected by the four strain gauges 66, and compare the calculated value with a threshold value. The control unit 110 vibrates the actuator 61 with the vibration generating circuit 114 when the values detected by the strain gauges 66 are equal to or greater than the threshold value.

In this way, the control circuit 100 vibrates the display unit 10 in response to pressing force in the Z direction when the pressing force has been applied in the Z direction to the surface of the display unit 10, that is, the display surface. As a result, the input device 1 gives tactile feedback via vibration of the display unit 10 to a touch operation on the display unit 10, and a haptic effect is realized.

As explained above, the input device 1 in the present embodiment includes an LCD panel 13, a touch sensor 12 arranged on the surface of the LCD panel 13, and a vibration generating unit 5 with an actuator 61 and strain gauges 66. The vibration generating unit 5 is arranged on the back surface side of the LCD panel 13 and is connected to the securing portions 13*b* provided on the back surface of the LCD panel 13 via rigid connecting members 8.

In this configuration, use of rigid connecting members 8 make it possible to suppress vibration and pressing force transmission loss between the vibration generating unit 5 and the LCD panel 13 and more efficiently transmit vibrations generated by the vibration generating unit 5 to the LCD panel 13. External force applied to the LCD panel 13 can also be more efficiently transmitted to the vibration generating unit 5, and the strain gauges 66 in the vibration generating unit 5 can more reliably detect external force applied to the LCD panel 13. As a result, tactile feedback that vibrates the LCD panel 13 in response to pressing the LCD panel 13 can be realized more efficiently.

Specifically, because vibration transmission loss is low, sufficient tactile feedback can be realized even when using a small, low-output actuator 61. Also, because vibration transmission loss is low, the LCD panel 13 can be vibrated strongly and stronger tactile feedback can be provided. In addition, because transmission loss in the path for transmitting pressing force applied to the LCD panel 13 to the strain gauges 66 is low, sensitivity of the strain gauges 66 and power consumed by the control circuit 100 can be reduced.

The connecting members 8 in the embodiment described above are rod-shaped members with male threading formed at the leading end 82, and the securing portions 13*b* have holes into which the male threading on the connecting members 8 can be screwed. As a result, the connecting members 8 can be easily and securely joined to the LCD panel 13. Using this configuration, vibration and external force transmission loss between the connecting members 8 and the LCD panel 13 can be further reduced.

In the embodiment described above, the vibration generating unit 5 includes an actuator 61 that generates vibrations, an actuator supporting portion 51 that supports the actuator 61, and a diaphragm 55 that is connected to the actuator 61 and that vibrates. The connecting members 8 connect the diaphragm 55 to the securing portions 13*b*. This configuration can both transmit vibrations generated by the actuator 61 to the connecting members 8 with low transmission loss, and reliably support the actuator 61 with the actuator supporting portion 51.

In the embodiment described above, the input device 1 is arranged on the back side of the LCD panel 13 and has a case 2 for housing the LCD panel 13 and the vibration generating unit 5. The actuator supporting portion 51 is secured to the case 2. In this configuration, the actuator 61 can be secured to the case 2 so as not to attenuate the vibrations generated by the actuator 61.

In the embodiment described above, a metal shield plate 3 is arranged between the case 2 and the LCD panel 13, and the shield plate 3 has through-holes 3*a* through which the connecting members 8 pass. In this configuration, the shield plate 3 can be arranged without impeding the transmission of vibrations or external force via the connecting members 8. This increases design freedom with respect to placement of the vibration generating unit 5.

In the embodiment described above, the input device 1 is located between the LCD panel 13 and the vibration generating unit 5 and includes a cover 14 that covers the back surface of the LCD panel 13. The cover 14 has through-hole 14*a* through which the connecting members 8 pass. In this configuration, the vibration generating unit 5 can be arranged on the back surface side of the cover 14 without impeding the transmission of vibrations or external force via the connecting members 8. This increases design freedom with respect to placement of the vibration generating unit 5.

In the embodiment described above, the LCD panel 13 is rectangular, four columnar securing portions 13b corresponding to the four corners of the LCD panel 13 are provided on the back surface of the LCD panel 13, connecting members 8 are connected to each of the four securing portions 13b, and the vibration generating unit 5 includes four strain detectors 66 arranged so as to correspond to the four connecting members 8. In this configuration, pressing force applied to the LCD panel 13 can be more reliably transmitted to the vibration generating unit 5 because the vibration generating unit 5 and the LCD panel 13 are connected via four connecting members 8.

In the embodiment described above, a control unit 110 is connected to the actuator 61 and the strain gauges 66, and generates vibrations with the actuator 61 based on detection results from the strain gauges 66. In this configuration, tactile feedback can be realized that vibrates the LCD panel 13 in response to operating force applied to the LCD panel 13.

The embodiment described above is just one possible embodiment of the present invention. Various modifications and applications can be realized without departing from the spirit and scope of the present invention.

In the embodiment described above, the diaphragm 55 has four panel connecting portions 55b and four strain gauges 66 are provided, one for each panel connecting portion 55b. However, the present invention is not limited to this embodiment. For example, the input device 1 may be configured to include five or more strain gauges 66. Alternatively, the number of strain gauges 66 may be smaller.

The input device 1 may also be configured to include a plurality of actuators 61. The actuator 61 may be positioned closer to the center of the LCD panel 13 or closer to the edge than to the center of the LCD panel 13 in the XY plane.

In the embodiment described above, the control circuit 100 is housed inside a board cover 16 on the back surface of the LCD panel 13. However, this is only one example. For example, the device may be configured so that the control circuit 100 is mounted on the circuit board 4.

Also, the strain detectors used to detect displacement of the flat plate portions 55c are not limited to strain gauges 66. For example, sensors may be used to magnetically, mechanically, or optically detect displacement of the panel connecting portions 55b in the Z direction. External force applied to the LCD panel 13 may also be detected by detecting displacement of the panel connecting portions 55b using acceleration sensors or angular velocity sensors.

KEY TO THE DRAWINGS

1: Input device
2: Case
3: Shield plate
3a: Through-hole (first through-hole)
4: Circuit board
4a: Through-hole
5: Vibration generating unit
8: Connecting member
11: Cover lens
12: Touch sensor
13: LCD panel (display panel)
13a: Cover
13b: Securing portion
14: Cover (cover member)
14a: Through-hole (second through-hole)
16: Board cover
22, 23: Protruding portion
51: Actuator support unit (support unit)
51a: Recessed portion
51b: Flat plate portion
51d: Opening
52: Leaf spring
54: Support column
55: Diaphragm (vibrating member)
55a: Protruding portion
55b: Panel connecting portion
55c: Flat plate portion
56: Threaded hole
57: Support plate
57a: Opening
61: Actuator
61a: Coil winding
61b: Core
61c: Bobbin
66: Strain gauge (strain detector)
81: Shaft portion
82: Leading end
83: Rear end
100: Control circuit
110: Control unit
112: Detection circuit
114: Vibration generating circuit

What is claimed is:

1. An input device comprising:
   a display panel;
   a touch sensor arranged over the surface of the display panel; and
   a vibration generating unit having an actuator, a vibration plate that vibrates due to vibration generated by the actuator, and a strain detection sensor that detects deformation of the vibration plate,
   wherein the vibration generating unit is arranged on the back side of the display panel and connected to a securing portion provided on the back surface of the display panel via a rigid connecting member,
   the rigid connecting member includes a columnar shaft portion, a leading end portion extended from one end of the columnar shaft portion and forming a male threading, and a first screw hole formed on an end surface of the other end of the columnar shaft portion opposite the leading end portion,
   the securing portion is provided on a cover that covers a back surface of the display panel and includes a second screw hole into which the male threading of the leading end portion of the rigid connecting member is screwed, and
   the male threading and the first screw hole are formed separately in the rigid connecting member so as to arrange the vibration generating unit spaced apart from the cover, and the other end of the columnar shaft portion contacts with the vibration plate and is secured to the vibration generating unit by fastening a screw to the first screw hole from the back surface side of the vibration plate.

2. The input device according to claim 1, further comprising: a case arranged on the back side of the display panel to accommodate the display panel and the vibration generating unit, wherein the supporting portion is secured to the case,
   wherein the vibration generating unit has a supporting portion that supports the actuator.

3. The input device according to claim 2, wherein a metal shield plate is arranged between the case and the display panel, and the shield plate has a shape with a first through-hole through which the rigid connecting member passes.

4. The input device according to claim 1, further comprising: a cover member arranged between the display panel and the vibration generating unit and covering the back surface of the display panel, the cover member having a shape with a second through-hole through which the rigid connecting member passes.

5. The input device according to claim 1, wherein the display panel is rectangular,
- four columnar securing portions corresponding to the four corners of the display panel are provided on the back surface of the display panel,
- the rigid connecting member is connected to each of the four securing portions, and
- the vibration generating unit includes four strain detection sensors arranged so as to correspond to the four rigid connecting members.

6. The input device according to claim 1, further comprising: a control circuit connected to the actuator and the strain detection sensor and generating vibrations with the actuator according to detection results from the strain detection sensor.

\* \* \* \* \*